US012772424B2

(12) United States Patent
Vettraino

(10) Patent No.: US 12,772,424 B2
(45) Date of Patent: Oct. 20, 2026

(54) DISPLAYS FOR SELF-SERVICE TERMINALS

(71) Applicant: NCR Atleos Corporation, Atlanta, GA (US)

(72) Inventor: Peter Roy Vettraino, Fife (GB)

(73) Assignee: NCR Atleos Corporation, Atlanta, GA (US)

( * ) Notice: Subject to any disclaimer, the term of this patent is extended or adjusted under 35 U.S.C. 154(b) by 751 days.

(21) Appl. No.: 17/899,845

(22) Filed: Aug. 31, 2022

(65) Prior Publication Data

US 2024/0074126 A1 Feb. 29, 2024

(51) Int. Cl.

*H05K 7/20* (2006.01)
*G02B 1/02* (2006.01)
*G02B 7/00* (2021.01)
*G02F 1/1333* (2006.01)

(52) U.S. Cl.

CPC ........... *H05K 7/20963* (2013.01); *G02B 1/02* (2013.01); *G02B 7/008* (2013.01); *G02F 1/133385* (2013.01)

(58) Field of Classification Search

None

See application file for complete search history.

(56) References Cited

U.S. PATENT DOCUMENTS

2003/0147036 A1* 8/2003 Kaise .................. H04N 9/3105 349/161
2004/0173301 A1* 9/2004 Tsai .................. G02F 1/133528 156/286
2011/0199733 A1* 8/2011 Hirabayashi ...... G02F 1/133382 361/707
2020/0341328 A1* 10/2020 Guo ..................... G03B 21/006
2023/0292476 A1* 9/2023 Kumano ................ G02B 27/01

* cited by examiner

*Primary Examiner* — Richard H Kim

(74) *Attorney, Agent, or Firm* — Schwegman Lundberg & Woessner, P.A.

(57) ABSTRACT

Disclosed are display systems for self-service terminals. The display systems may include a display panel, a first transparent material and a second transparent material. The second transparent material may be located in between the first transparent material and the display panel. The first transparent material may have a first thermal conductivity and the second transparent material may have a second thermal conductivity. The second thermal conductivity may be greater than the first thermal conductivity.

20 Claims, 11 Drawing Sheets

DISPLAYS FOR SELF-SERVICE TERMINALS

SUMMARY

Disclosed are display systems for self-service terminals. The display systems may include a display panel, a first transparent material and a second transparent material. The second transparent material may be located in between the first transparent material and the display panel. The first transparent material may have a first thermal conductivity and the second transparent material may have a second thermal conductivity. The second thermal conductivity may be greater than the first thermal conductivity.

BRIEF DESCRIPTION OF THE FIGURES

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

Corresponding reference characters indicate corresponding parts throughout the several views. The exemplifications set out herein illustrate exemplary embodiments of the disclosure, and such exemplifications are not to be construed as limiting the scope of the disclosure in any manner.

DETAILED DESCRIPTION

Figure 1:
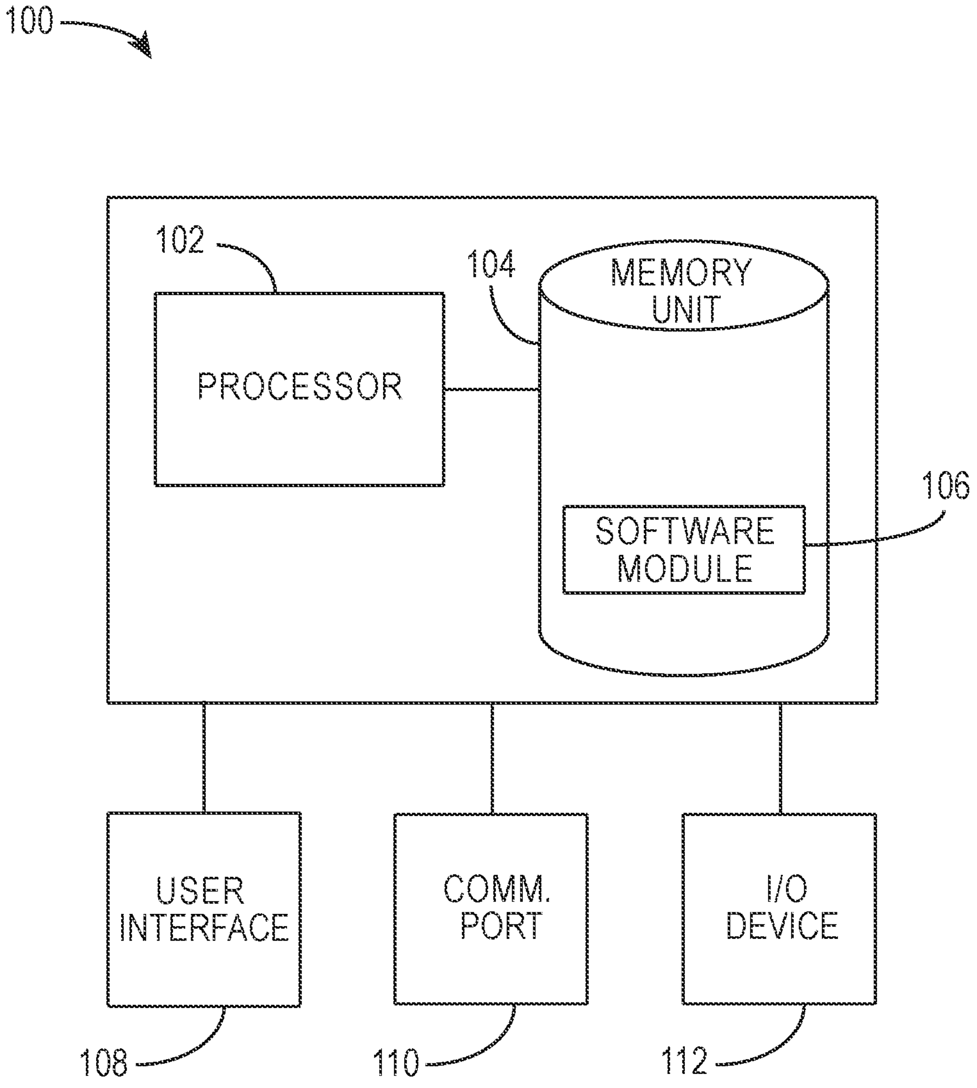
FIG. 1 shows an example schematic of a self-service terminal consistent with at least one embodiment of this disclosure.

When a display is operated in an exterior environment, the visible and near-infrared (IR) solar radiation may pass through the front glass of the display and may be absorbed by the front liquid crystal display (LCD) sandwich of the LCD panel. Note that the front glass in the display is transparent to visible and near-IR radiation and is not heated by it. The solar heating of the LCD panel may cause the temperature of the LCD panel to rise beyond a specified working range, which may result in the liquid crystal layer failing to correctly operate such that the image becomes black. This is sometimes referred to as display clearing. The traditional solution for this is to cool the LCD panel by forcing air across its front surface, using forced air thermal convection to cool the surface. This introduces several negative factors. First a sizable air gap is required between the front glass of the display and the surface of the LCD panel, which introduces parallax. Second, the need for the air gap prevents optically bonding of the LCD to the front glass. This introduces air-glass and glass-air material transitions which each cause a reflection of approximately 4% of the light coming from either side. This results in the user seeing stronger reflections obscuring the image, and a slightly lower brightness from the display.

Third, the air passing over the display can carry contaminants that deposit on the LCD and inner surface of the front glass over time, degrading image quality. Fourth, space limitations usually mean that the fans need to be mounted behind the display with complex ducting used to route the air to the air gap in front of the LCD panel. And finial, when the external air temperature is below OC, the air gap allows moisture in the internal air to freeze on the rear surface of the front glass, causing frosting.

As disclosed herein, a thin layer of highly conductive material, such as a sapphire crystal, can be in contact with, and optionally bonded to, the front surface of the LCD panel to conduct the thermal energy away from the LCD layer by thermal conduction. This eliminates the need for the air gap and all the associated negative factors introduced by an air gap. This is possible since the highly conductive transparent material, such as sapphire crystal, is an optically transparent material made of crystallized aluminum oxide, with a thermal conductivity of (34.6 to 40 W/m·K), which is approximately equal to that of steel, and dramatically higher than that of standard glass (1.05 W/m·K), or air (0.026 W/m·K). This high thermal conductivity allows the heat absorbed by the LCD sandwich to conduct through the sapphire crystal layer where it can be dissipated via a heatsink thermally bonded around the border of the sapphire crystal sheet.

Using the systems disclosed herein, the display layer construction, as shown via results of computational fluid dynamics (CFD) simulations, demonstrate that the high thermal conductivity layer can successfully conduct the thermal energy away from the LCD panel, and into the heatsink even under maximum solar load in an ambient temperature of 50 C, dropping the LCD surface temperature from 94.24 C to 72.30 C.

The above discussion is intended to provide an overview of subject matter of the present patent application. It is not intended to provide an exclusive or exhaustive explanation of the invention. The description below is included to provide further information about the present patent application.

Turning now to the figures, FIG. 1 shows an example schematic of a self-service terminal 100. As shown in FIG. 1, self-service terminal 100 may include a processor 102 and a memory 104. Memory 104 may include a software module 106. While executing on processor 102, software module 104 may perform processes for operating the self-service terminal, including, for example, accepting banknotes and checks and dispensing banknotes. Self-service terminal 100 also may include a user interface 108, a communications port 110, and an input/output (I/O) device 112.

User interface 108 can include any number of devices that allow a user to interface with self-service terminal 100. Non-limiting examples of user interface 108 include a keypad, a microphone, a display (LCD, touchscreen, or otherwise), etc.

Communications port 110 may allow self-service terminal 100 to communicate with various information sources and devices, such as, but not limited to, remote computing devices such as servers or other remote computers maintained by financial institutions, mobile devices such as a user's smart phone, peripheral devices, etc. Non-limiting examples of communications port 110 include, Ethernet cards (wireless or wired), BLUETOOTH® transmitters and receivers, near-field communications modules, etc.

I/O device 112 may allow self-service terminal 100 to receive and output information. Non-limiting examples of I/O device 112 include, a camera (still or video), fingerprint or other biometric scanners, displays (LCD, touchscreen, or otherwise), etc.

Figure 2A:
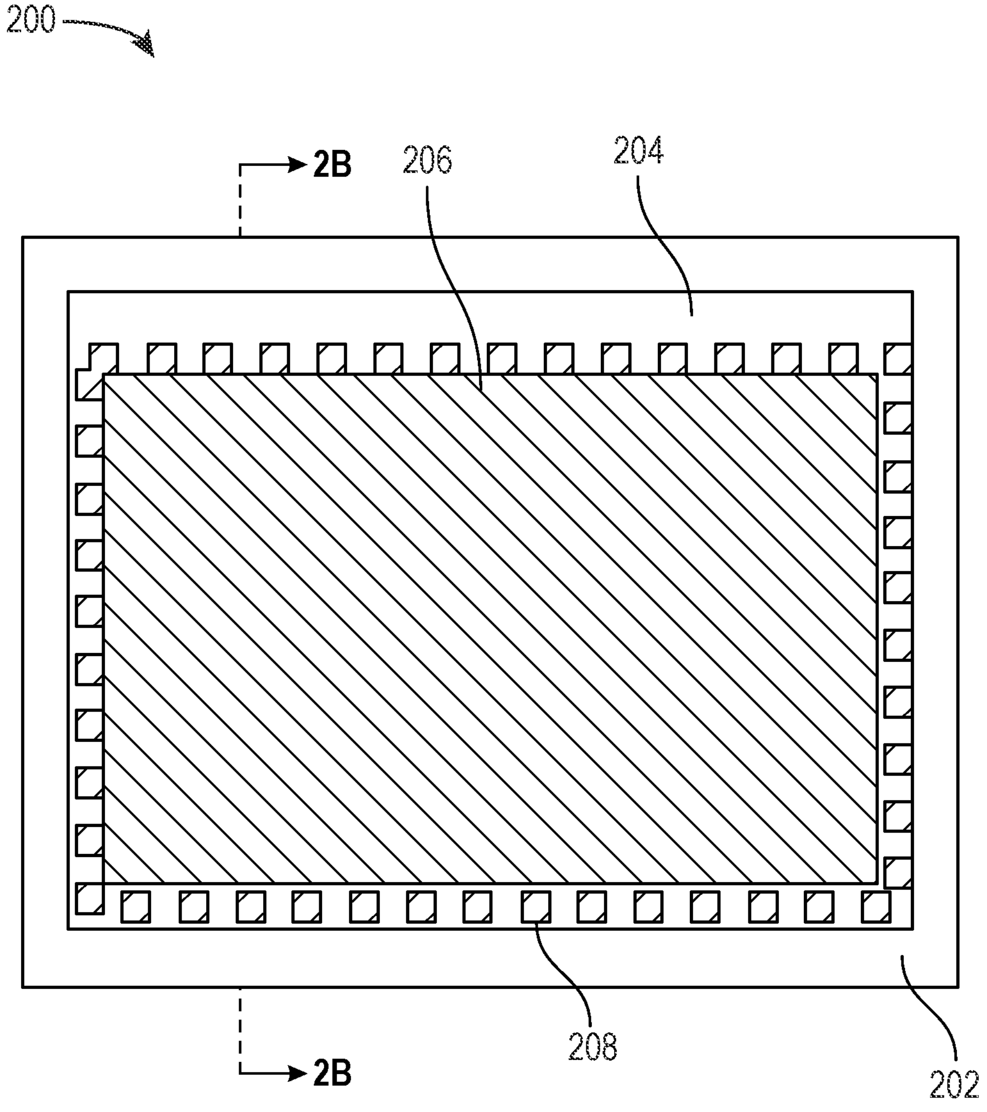
FIG. 2A shows a rear view of a display unit consistent with at least one embodiment of this disclosure.
Figure 2B:
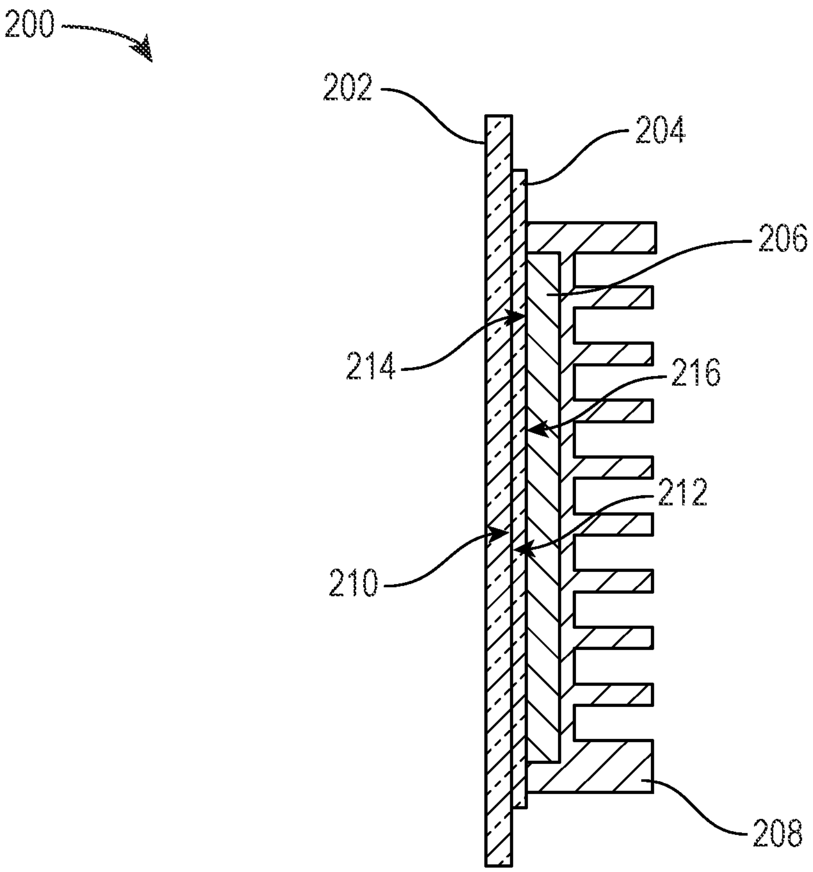
FIG. 2B shows a section view of the display unit in FIG. 2A consistent with at least one embodiment of this disclosure.

FIG. 2A shows a rear view of a display unit 200 consistent with at least one embodiment of this disclosure. FIG. 2B shows a section view of display unit 200 consistent with at least one embodiment of this disclosure. Display unit 200 may be a user interface, such as user interface 108 and/or an I/O device, such as I/O device 112.

As disclosed herein, display unit 200 may include a first transparent material 202, a second transparent material 204, a display panel 206, and a heat sink 208. As disclosed herein, first transparent material 202 may be a clear plastic, clear glass, or other transparent material that is exposed to the elements, such as weather, and allow the user to operate a self-service terminal, such as when display unit is part of a touchscreen display. Non-limiting examples of first transparent material 202 include, glass (tempered or otherwise) and polymers, such as polycarbonate materials, etc.

First transparent material 202 may be optically bonded to second transparent material 204. For example, a first surface 210 of second transparent material may be optically bonded to a first surface 212 of first transparent material 202 to protect second transparent material from damage. Bonding second transparent material 204 to first transparent material 202 results in there not being any voids, which may trap air, in between first transparent material 202 and second transparent materials 204.

Display panel 206 may be any type of display panel used in self-service terminals. For example, and as disclosed herein, display panel 206 may be an LCD display used to present information to users during a transaction. While LCD display panels are used as examples herein, other display panel types, such as light emitting diode (LED) display panels may be used without departing from the scope of this disclosure.

Second transparent material 204 may be a thin layer of material with a high thermal conductivity, such as a material that comprises crystallized aluminum oxide. As an example, second transparent material 204 may be a sapphire crystal. As disclosed herein, second transparent material 204 may be optically bonded to display panel 206. For example, a first surface 214 of display panel 206 may be optically bonded to a second surface 216 of second transparent material 204 to conduct thermal energy away from display panel 206 by thermal conduction. In one example, a transparent thermal paste may be used to bond second transparent material 204 to display panel 206. With or without the use of thermal paste, the contact between second transparent material 204 and display panel 206 eliminates the need for the air gap and all the associated negative factors the air gap creates. Stated another way, bonding second transparent material 204 to display panel 206 results in there not being any voids, which may trap air, in between display panel 206 and second transparent materials 204.

As disclosed herein, second transparent material 204 may be an optically transparent material made of crystallized aluminum oxide, such as sapphire, with a thermal conductivity of about 34 to 40 W/m·K, which is approximately equal to that of steel, and dramatically higher than that of standard glass which has a thermal conductivity of about 1 W/m·K or air which has a thermal conductivity of about 0.026 W/m·K. Stated another way, second transparent material 204 has a thermal conductivity that is at least 1 to 2 orders of magnitude greater than that of glass and/or air.

This high thermal conductivity allows the heat absorbed by display unit 200 to conduct through second transparent material 204 where it can be dissipated via heatsink 208, which may be thermally bonded around the border of second transparent material 204 as shown in FIGS. 2A and 2B.

CFD simulations show the effect of second transparent material 204. The simulations disclosed herein had an ambient air temperature of 50 C and a solar load of 1,100 W/m2.

Figure 3:
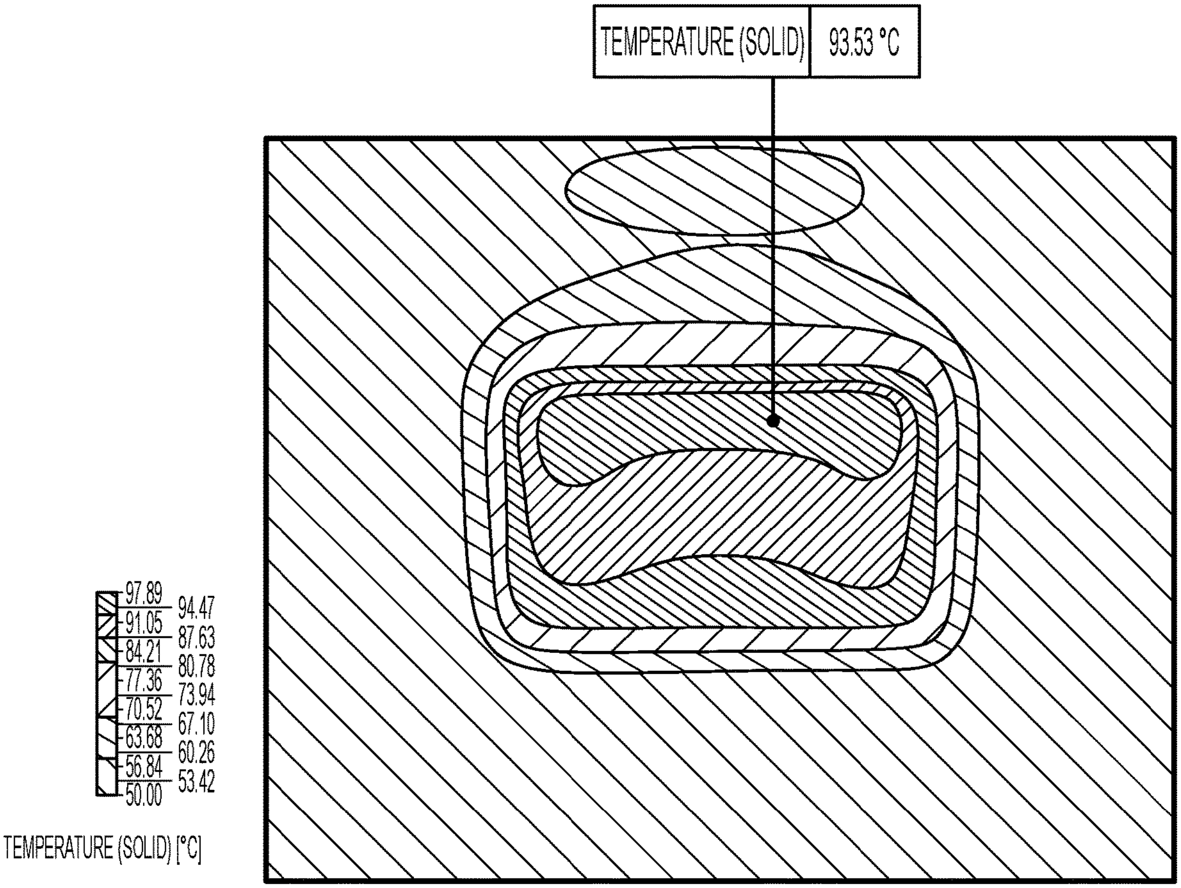
FIG. 3 shows a heat mapping for a display unit.
Figure 4:
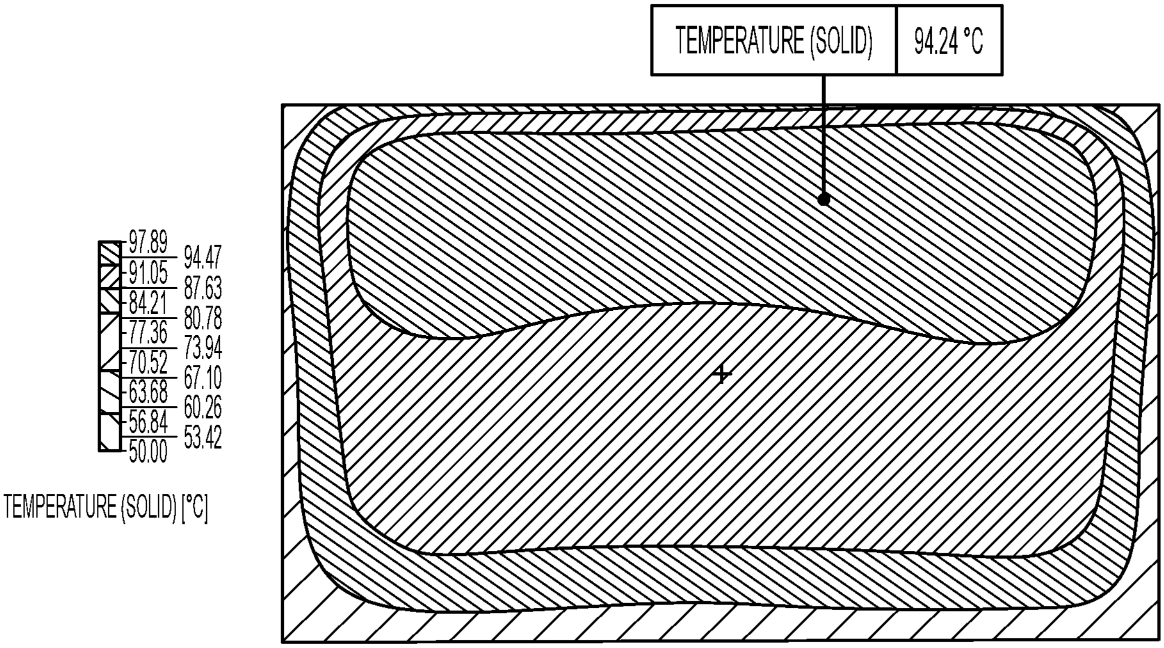
FIG. 4 shows a heat mapping for a display unit.

FIGS. 3 and 4 each shows the result of a simulation for a 7-inch LCD display optically bonded to a standard front glass, with no Sapphire crystal layer added. FIG. 3 shows the front glass (i.e., first trans parent material 202) surface temperature and FIG. 4 shows the LCD panel (i.e., display panel 206) surface temperature. As shown in FIGS. 3 and 4, the temperatures of the LCD panel and the front glass reach upwards of 94 C.

Figure 5:
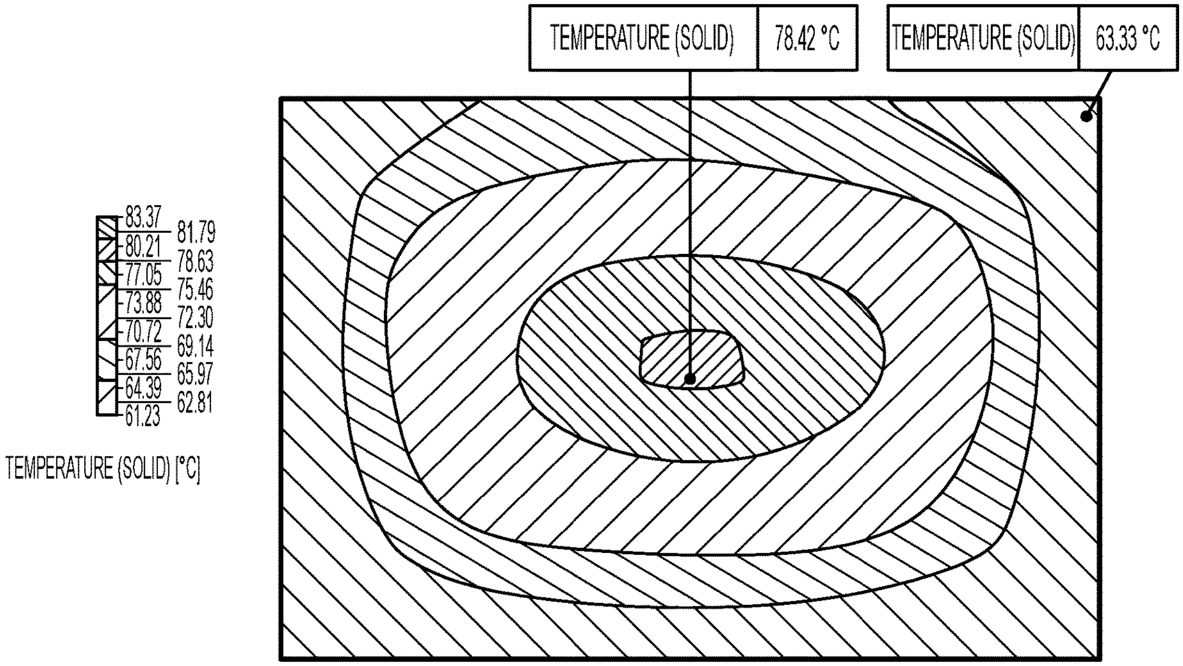
FIG. 5 shows a heat mapping for a display unit consistent with at least one embodiment of this disclosure.
Figure 6:
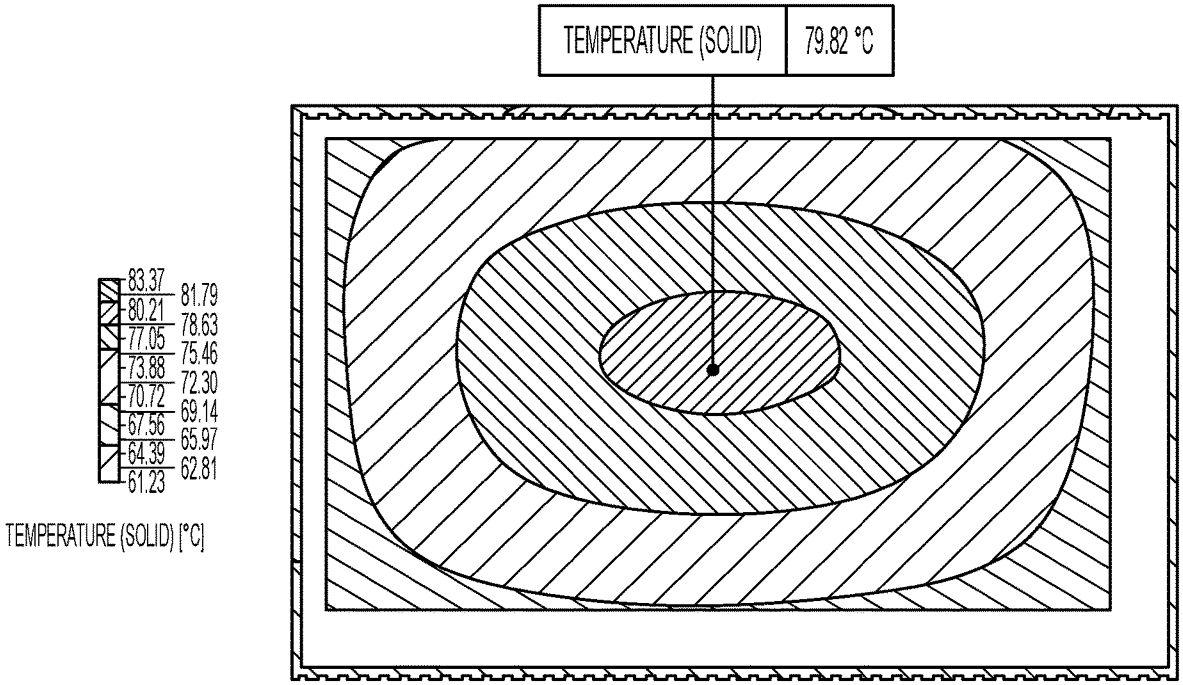
FIG. 6 shows a heat mapping for a display unit consistent with at least one embodiment of this disclosure.

FIGS. 5 and 6 each shows the result of simulations for a display panel having a 2 mm thick layer of sapphire glass (i.e., the second transparent material) thermally bonded to a front of the LCD panel with a heatsink, such as heat sink 208, added to aid in dissipation of heat from sapphire glass layer. As shown in FIGS. 5 and 6, the use of sapphire and a heatsink lowers the temperatures to around 79 C. This is a drop in temperature of about 15 C, which is significant and helps avoid display clearing.

Figure 7:
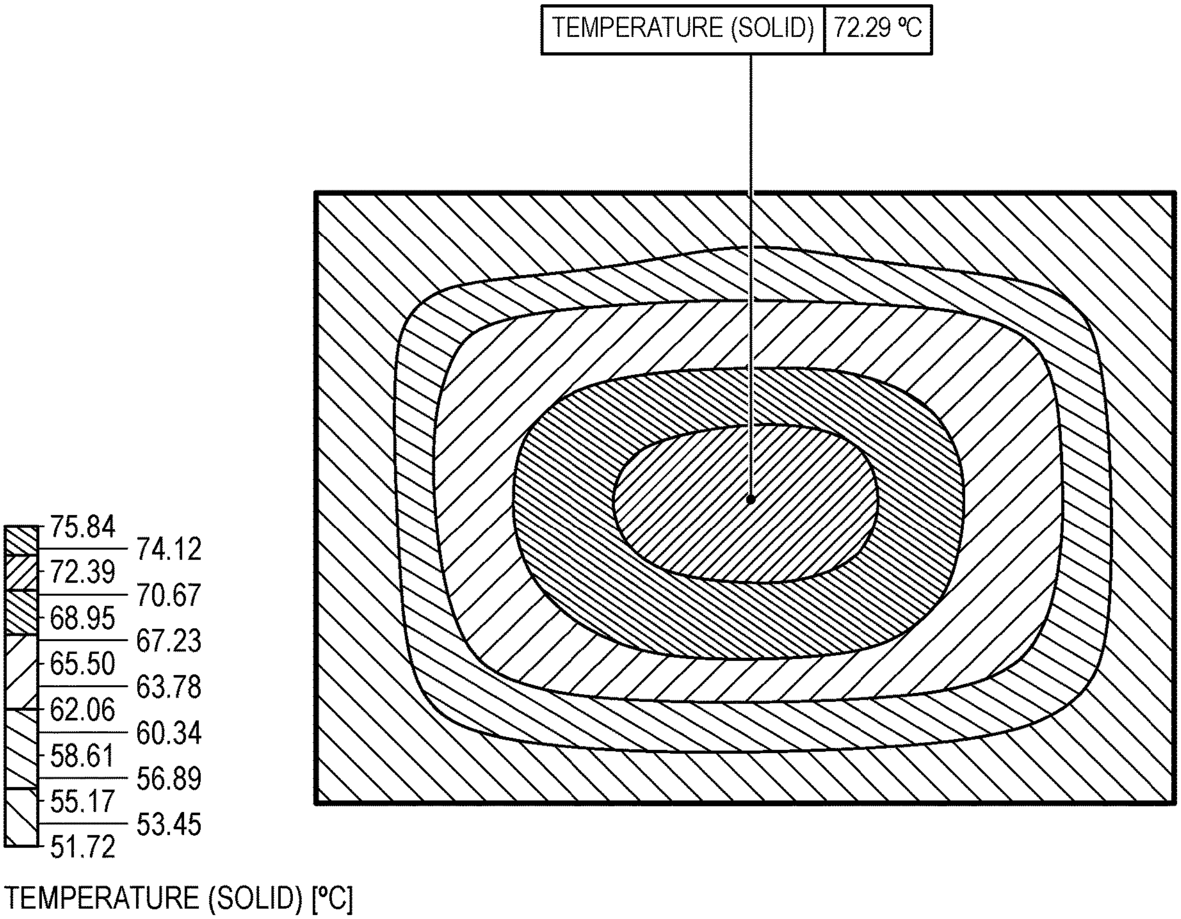
FIG. 7 shows a heat mapping for a display unit consistent with at least one embodiment of this disclosure.
Figure 8:
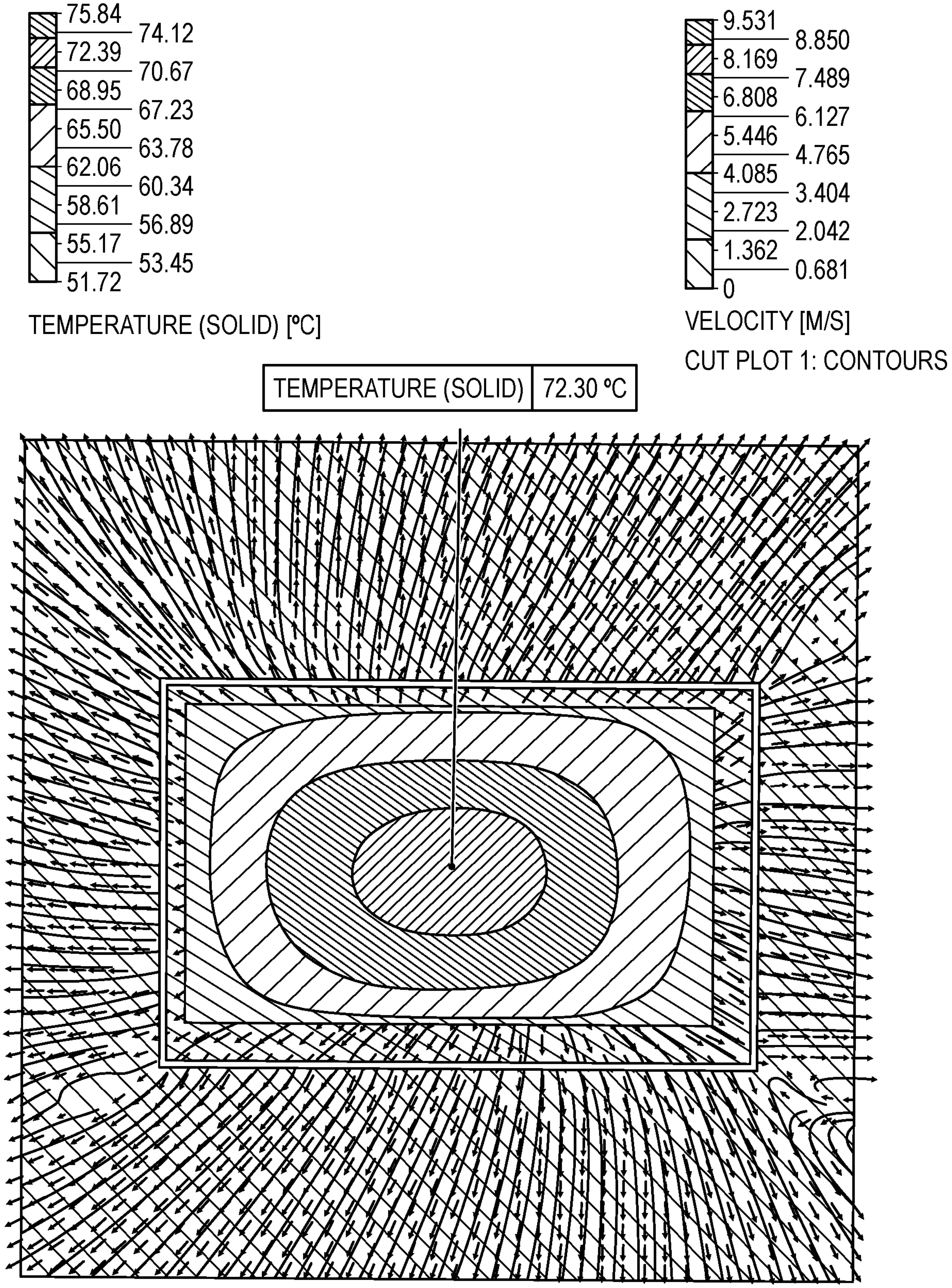
FIG. 8 shows a heat mapping for a display unit consistent with at least one embodiment of this disclosure.

FIGS. 7 and 8 show the results of simulations for a display panel having a 2 mm thick layer of sapphire glass thermally bonded to a front of the LCD panel with a heatsink and forced convection by blowing air over the heatsink. As shown in FIGS. 7 and 8, the use of sapphire, a heatsink, and forced convection lowers the temperatures to around 72 C. This is a drop in temperature of over 20 C, which is significant and helps avoid display clearing.

Figure 9:
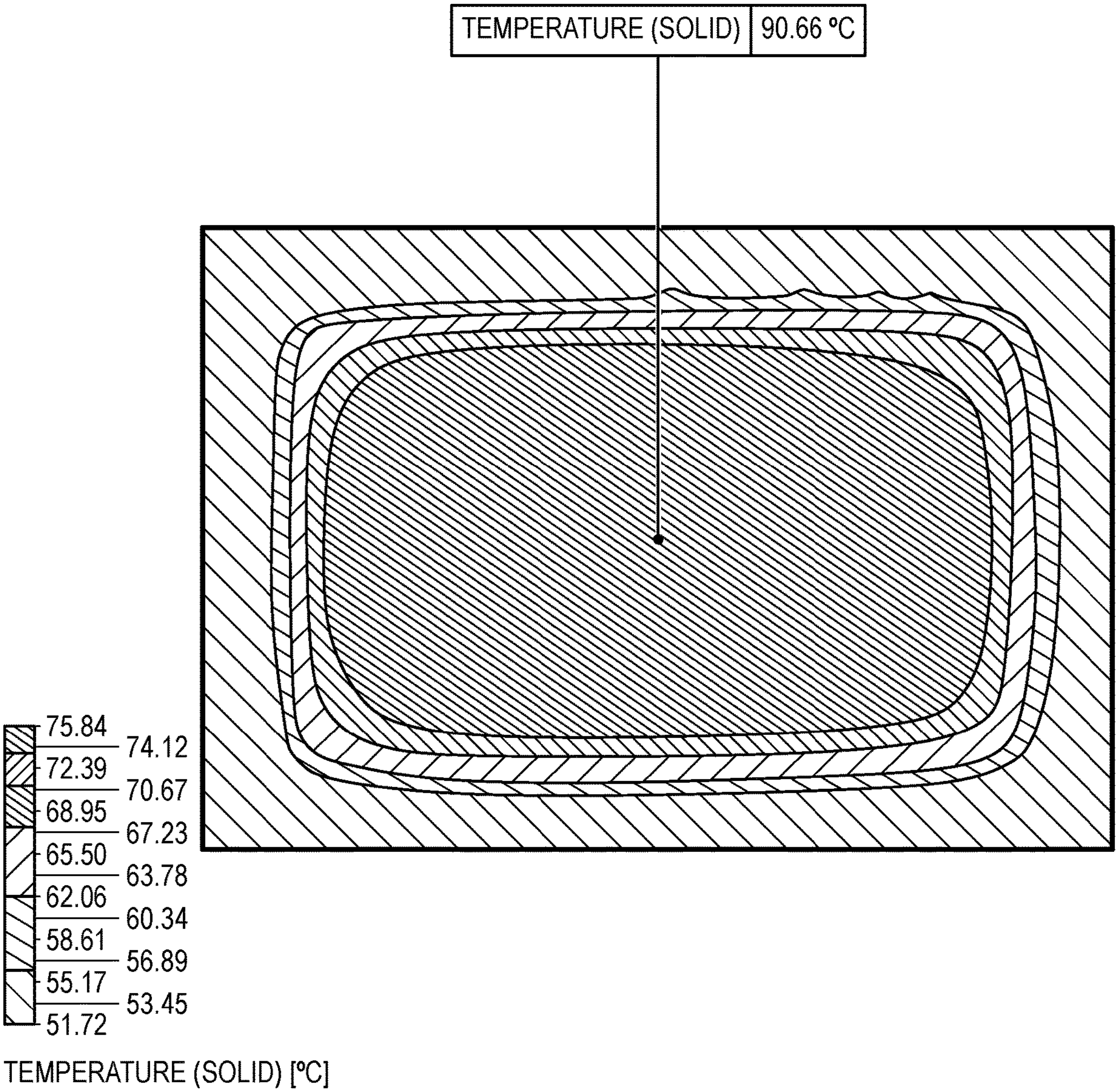
FIG. 9 shows a heat mapping for a display unit.
Figure 10:
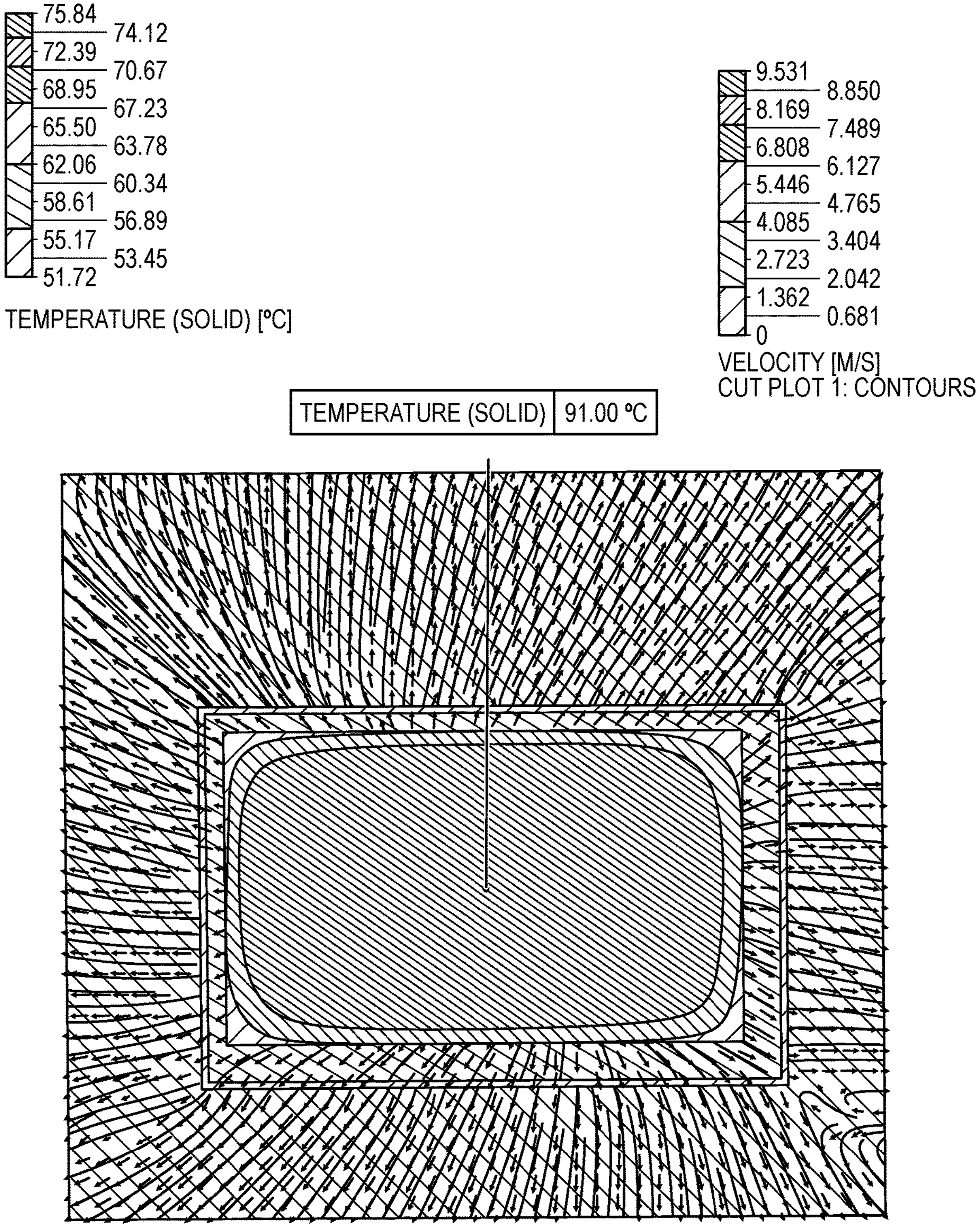
FIG. 10 shows a heat mapping for a display unit.

FIGS. 9 and 10 demonstrate the improvement the sapphire crystal layer makes by showing a simulation repeated as shown in FIGS. 8 and 9, but with the sapphire crystal layer replaced by standard glass. As shown in FIGS. 9 and 10, using standard glass results in temperatures of around 91 C.

These results demonstrate that a thermally conductive layer, such as a sapphire crystal layer, can successfully conduct the thermal energy away from an LCD panel, and in into the heatsink even under maximum solar load in an ambient temperature of 50 C, dropping the LCD surface temperature from 94.24 C to 72.30 C, again, which is a significant decrease in operating temperatures.

Note that for simplicity the simulations used a single fluid volume, so the "interior" (i.e., the air temperature inside the self-service terminal) and "exterior" (i.e., the air temperature outs or ambient air) air temperatures were both 50 C. Implementing a more detailed assembly for the simulation where the interior air temperature was at a maximum of 40 C instead of 50 C would further improve the cooling efficiency of the sapphire glass layer and heatsink, and the LCD surface temp would be approximately a further 10 C cooler.

EXAMPLES AND NOTES

The following, non-limiting examples, detail certain aspects of the present subject matter to solve the challenges and provide the benefits discussed herein, among others.

Example 1 is a display system for a self-service terminal, the display system comprising: a display panel; a first transparent material having a first thermal conductivity; and a second transparent material located in between the first transparent material and the display panel, the second transparent material having a second thermal conductivity, the second thermal conductivity being greater than the first thermal conductivity.

In Example 2, the subject matter of Example 1 optionally includes wherein the second transparent material is impregnated with crystallized aluminum oxide.

In Example 3, the subject matter of any one or more of Examples 1-2 optionally include wherein the second transparent material is sapphire.

In Example 4, the subject matter of any one or more of Examples 1-3 optionally include a thermal paste in contact with both the first transparent material and the second transparent material.

In Example 5, the subject matter of any one or more of Examples 1~4 optionally include a heat sink attached to the second transparent material.

In Example 6, the subject matter of Example 5 optionally includes a thermal paste in contact with both the heat sink and the display panel.

In Example 7, the subject matter of any one or more of Examples 1-6 optionally include order of magnitude.

In Example 8, the subject matter of any one or more of Examples 1-7 optionally include wherein there is not any voids between the display panel and the first and second transparent materials.

Example 9 is a display system for a self-service terminal, the display system comprising: a display panel having a display surface; a first transparent material having a first surface and a first thermal conductivity; and a second transparent material having a first surface in contact with the first surface of the first transparent material and a second surface in contact with the display surface, the second transparent material having a second thermal conductivity, the second thermal conductivity being substantially greater than the first thermal conductivity.

In Example 10, the subject matter of Example 9 optionally includes wherein the second transparent material is impregnated with crystallized aluminum oxide.

In Example 11, the subject matter of any one or more of Examples 9-10 optionally include wherein the second transparent material is sapphire.

In Example 12, the subject matter of any one or more of Examples 9-11 optionally include a thermal paste located in between the first surface of the first transparent material and the first surface of the second transparent material.

In Example 13, the subject matter of any one or more of Examples 9-12 optionally include a heat sink attached to the second transparent material.

In Example 14, the subject matter of any one or more of Examples 12-13 optionally include a thermal paste in contact with both the heat sink and the display panel.

In Example 15, the subject matter of any one or more of Examples 9-14 optionally include order of magnitude.

In Example 16, the subject matter of any one or more of Examples 9-15 optionally include wherein there is not any voids between the first surface of the first transparent material and the first surface of the second transparent material.

Example 17 is a self-service terminal comprising: a display panel; a first transparent material having a first thermal conductivity; a second transparent material comprising crystallized aluminum oxide, the second transparent material located in between the first transparent material and the display panel, the second transparent material having a second thermal conductivity, the second thermal conductivity being greater than the first thermal conductivity; and a heat sink in contact with the second transparent material.

In Example 18, the subject matter of Example 17 optionally includes wherein the second transparent material is a sapphire panel.

In Example 19, the subject matter of any one or more of Examples 17-18 optionally include order of magnitude.

In Example 20, the subject matter of any one or more of Examples 17-19 optionally include wherein there is not any voids between the display panel and the first and second transparent materials.

In Example 21, the display systems, display panels, self-service terminals, of any one or any combination of Examples 1-20 can optionally be configured such that all elements or options recited are available to use or select from.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A display system for a self-service terminal, the display system comprising:

a display panel;

a first transparent material having a first thermal conductivity; and a second transparent material located in between the first transparent material and the display panel, the second transparent material having a second thermal conductivity, the second thermal conductivity being greater than the first thermal conductivity;

wherein the second transparent material has a thermal conductivity of about 34 to 40 W/m·K;

wherein the first transparent material is exposed to weather and is an outermost transparent layer of the display system; and wherein the display system is configured for operation in an exterior environment where visible and near-infrared solar radiation passes through the first transparent material and is absorbed by the display panel, and the second transparent material conducts thermal energy away from the display panel by thermal conduction to prevent a display panel temperature from rising beyond a specified working range that would result in display clearing.

2. The display system of claim 1, wherein the second transparent material is impregnated with crystallized aluminum oxide.

3. The display system of claim 1, wherein the second transparent material is sapphire.

4. The display system of claim 1, further comprising a thermal paste in contact with both the first transparent material and the second transparent material.

5. The display system of claim 1, further comprising a heat sink attached to the second transparent material.

6. The display system of claim 5, further comprising a thermal paste in contact with both the heat sink and the display panel.

7. The display system of claim 1, wherein the second thermal conductivity is greater than the first thermal conductivity by at least 1 order of magnitude.

8. The display system of claim 1, wherein there is not any voids between the display panel and the first transparent material and the second transparent material.

9. A display system for a self-service terminal, the display system comprising:

a display panel having a display surface;

a first transparent material having a first surface and a first thermal conductivity; and a second transparent material having a first surface in contact with the first surface of the first transparent material and a second surface in contact with the display surface, the second transparent material having a second thermal conductivity, the second thermal conductivity being substantially greater than the first thermal conductivity;

wherein the second transparent material has a thermal conductivity of about 34 to 40 W/m·K;

wherein the first transparent material is exposed to weather and is an outermost transparent layer of the display system; and wherein the display system is configured for operation in an exterior environment where visible and near-infrared solar radiation passes through the first transparent material and is absorbed by the display panel, and the second transparent material conducts thermal energy away from the display panel by thermal conduction to prevent a display panel temperature from rising beyond a specified working range that would result in display clearing.

10. The display system of claim 9, wherein the second transparent material is impregnated with crystallized aluminum oxide.

11. The display system of claim 9, wherein the second transparent material is sapphire.

12. The display system of claim 9, further comprising a thermal paste located in between the first surface of the first transparent material and the first surface of the second transparent material.

13. The display system of claim 12, further comprising a thermal paste in contact with both a heat sink and the display panel.

14. The display system of claim 9, further comprising a heat sink attached to the second transparent material.

15. The display system of claim 9, wherein the second thermal conductivity is greater than the first thermal conductivity by at least 1 order of magnitude.

16. The display system of claim 9, wherein there is not any voids between the first surface of the first transparent material and the first surface of the second transparent material.

17. A self-service terminal comprising:

a display panel;

a first transparent material having a first thermal conductivity;

a second transparent material comprising crystallized aluminum oxide, the second transparent material located in between the first transparent material and the display panel, the second transparent material having a second thermal conductivity, the second thermal conductivity being greater than the first thermal conductivity; and a heat sink in contact with the second transparent material;

wherein the second transparent material has a thermal conductivity of about 34 to 40 W/m·K;

wherein the first transparent material is exposed to weather and is an outermost transparent layer of the display system; and wherein the self-service terminal is configured for operation in an exterior environment where visible and near-infrared solar radiation passes through the first transparent material and is absorbed by the display panel, and the second transparent material conducts thermal energy away from the display panel by thermal conduction to prevent a display panel temperature from rising beyond a specified working range that would result in display clearing.

18. The self-service terminal of claim 17, wherein the second transparent material is a sapphire panel.

19. The self-service terminal of claim 17, wherein the second thermal conductivity is greater than the first thermal conductivity by at least 1 order of magnitude.

20. The self-service terminal of claim 17, wherein there is not any voids between the display panel and the first transparent material and the second transparent material.

* * * * *